United States Patent [19]
Yokota et al.

[11] Patent Number: 5,123,074
[45] Date of Patent: Jun. 16, 1992

[54] SUBSTRATE FOR MOUNTING OPTICAL COMPONENTS AND ELECTRIC CIRCUIT COMPONENTS THEREON AND METHOD FOR MAKING SAME

[75] Inventors: Takashi Yokota, Yamato; Eiji Kikuchi, Yokohama; Shoichi Miura, Sagamihara; Hirosuke Furuta, Fukuoka; Masayuki Shiga, Isehara, all of Japan

[73] Assignee: Fujitsu Limited, Kawasaki, Japan

[21] Appl. No.: 432,727

[22] PCT Filed: Feb. 22, 1989

[86] PCT No.: PCT/JP89/00176
§ 371 Date: Oct. 26, 1989
§ 102(e) Date: Oct. 26, 1989

[87] PCT Pub. No.: WO89/08374
PCT Pub. Date: Sep. 8, 1989

[30] Foreign Application Priority Data

Feb. 26, 1988 [JP] Japan .................. 63-044741
Feb. 26, 1988 [JP] Japan .................. 63-044742

[51] Int. Cl.$^5$ .............................. G02B 6/12
[52] U.S. Cl. .............................. 385/95; 385/96
[58] Field of Search ................. 350/96.11, 96.20

[56] References Cited
U.S. PATENT DOCUMENTS

| | | | |
|---|---|---|---|
| 4,755,017 | 7/1988 | Kampany | 350/96.18 |
| 4,779,946 | 10/1988 | Pimpinella et al. | 350/96.20 |
| 4,867,524 | 9/1989 | Courtney et al. | 350/96.11 |

Primary Examiner—William L. Sikes
Assistant Examiner—Robert E. Wise
Attorney, Agent, or Firm—Staas & Halsey

[57] ABSTRACT

A substrate for mounting optical components and electric circuit components thereon, comprising an insulating substrate on which an electric circuit is to be formed and a metallic portion on which optical components are to be fixed by welding. This construction may be reversed; that is, an insulated layer on which an electric circuit is to be formed may be provided on a metallic board on which optical components are to be fixed by welding. A device constituted using this substrate permits improvement of the frequency band characteristic and a long-term stabilization of optical coupling efficiency.

13 Claims, 6 Drawing Sheets

SUBSTRATE FOR MOUNTING OPTICAL COMPONENTS AND ELECTRIC CIRCUIT COMPONENTS THEREON AND METHOD FOR MAKING SAME

BACKGROUND OF THE INVENTION

1. Field of the Invention

The present invention relates to a substrate capable of mounting thereon optical components and electric circuit components together, as well as a method for making same.

The terminology "optical component or components" as referred to herein indicates one or plural optical element mounted on or received in a suitable structural member, the optical element or elements functioning to change or control the intensity, wavelength, phase, polarized state, beam shape or direction of light which has been propagated through a medium (e.g. glass or air). As examples of such optical elements are mentioned lens, prism, mirror and optical fiber.

2. Description of the Background Art

Because of the advantage of optical fiber as a transmission path, the optical communication and optical transmission technique has come to be used in various fields. For example, in a general optical communication system, the transmitter side transmits light which has been subjected to intensity modulation on the basis of transmission information (electric signal), while the receiver side detects the transmitted light signal directly and reproduces the original transmission information. In such an optical transmission system, an electric circuit for processing the electric signal on the transmitter or receiver side or in a repeater section is an essential component and it is necessary to prevent the deterioration of the frequency band characteristic which is attributable to the wiring form, etc.

According to the prior art, an electro-optical converting section on the transmitter side has been constituted, for example, as shown in FIG. 1, in which a photosemiconductor sealed-device part 1 with a photosemiconductor device such as LD (laser diode) or LED(light emitting diode) sealed in a package is fixedly held in a predetermined positional relation to a first lens 2, an optical isolator 3, a second lens 4 and a fiber assembly 5 to form a photosemiconductor module 6, which module 6 is electrically connected to a drive circuit 7. The reason why the photosemiconductor sealed-device 1 and optical components such as lenses, optical isolator, etc. are combined as a module is that, particularly in the case where the light transmission path is a single mode fiber, it is necessary to set a relative positional relation of the components with an accuracy of within 1 μm.

In the above structure, however, a limit is encountered in shortening the wiring between a drive circuit which constitutes the electric circuit and the photosemiconductor sealed-device, so there has been a problem that restriction is imposed on the frequency band characteristic. Another problem is that the device becomes larger in size because it is necessary to constitute the drive circuit portion and the photosemiconductor module separately from each other.

In view of the above problems there has been proposed such a structure as shown in FIG. 2. On an insulating substrate 10 there are formed wiring patterns 11 capable of making connection between a photosemiconductor device and a driving or amplifying circuit for the photosemiconductor device. Further, a fiber assembly 13 is fixed onto the insulating substrate 10 directly with an adhesive or by soldering through a metallic pattern 12 formed in the same manner as the wiring patterns 11 as shown in the figure. For example, the fiber assembly 13 as an optical component is constituted by inserting and fixing a ferrule 15 with an optical fiber 14 inserted and fixed therein into a cylindrical housing 17 with a lens 16 press-fitted therein. The lens 16 as an optical element functions to change the shape of light beam emitted from an emission end of the optical fiber 14 serving as a light guiding optical element and radiated into the air, into a collimated beam for example.

In the prior art shown in FIG. 2, however, there is a problem that the reliability is low in the case of fixing the fiber assembly as an optical component directly onto the insulating substrate using an adhesive, while in the case of fixing it onto the metallic pattern by soldering there has been a problem that the optical coupling efficiency changes with the lapse of time due to creeping of the soldered portion over a long period.

Accordingly, it is an object of the present invention to provide a substrate for mounting optical components and electric circuit components thereon which substrate overcomes the above-mentioned problems of the prior art and permits improvement of the frequency band characteristic, reduction in size of the device and a long-term stabilization of optical coupling efficiency.

It is another object of the present invention to provide a method for making a substrate for mounting optical components and electric circuit components thereon which substrate permits improvement of the frequency band characteristic, reduction in size of the device and a long-term stabilization of optical coupling efficiency.

SUMMARY OF THE INVENTION

According to one aspect of the present invention, there is provided a substrate for mounting optical components and electric circuit components thereon, comprising an insulating substrate on which is formed an electric circuit and a metallic portion attached to the insulating substrate, with optical components being fixed to the metallic portion by welding. The substrate is constituted, for example, by bonding the metallic portion to the insulating substrate or by embedding or press fitting metallic lands in the insulating substrate.

According to another aspect of the present invention, there is provided a substrate for mounting optical components and electric circuit components thereon, comprising a metallic board on which are fixed optical components by welding and an insulator layer formed on the metallic board, with an electric circuit being formed on the insulator layer. This substrate is constituted, for example, by using an insulating substrate as the insulator layer and bonding it to the metallic board.

According to a further aspect of the present invention, there is provided a method for making a substrate for mounting optical components and electric circuit components thereon, which method comprises forming inserting holes extending from the top surface to the back of an insulating substrate, inserting a cylindrical metal member longer than the thickness of the insulating substrate into each of the insertion holes in close contact therewith, deforming end portions of the cylindrical metal member by applying impact thereto to thereby fix the cylindrical metal member firmly to the insulating substrate, and cutting the cylindrical metal member so as to become substantially flush with the top surface of the insulating substrate.

According to still further aspect of the present invention, there is provided a method for making a substrate for mounting optical components and electric circuit components thereon, which method comprises forming a convex portion on a metallic board onto which optical components are to be fixed, forming a ceramic layer on the convex-formed side of the metallic board by spray coating, abrading the ceramic layer to expose the convex portion, and forming wiring patterns on the abraded surface of the ceramic layer.

DESCRIPTION OF THE PREFERRED EMBODIMENTS

Figure 1:
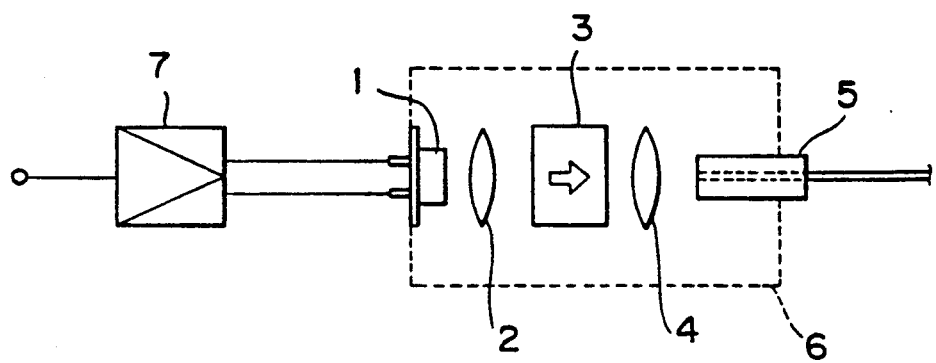
FIG. 1 is a schematic view of a conventional electro-optical converting section on a transmitter side.
Figure 2:
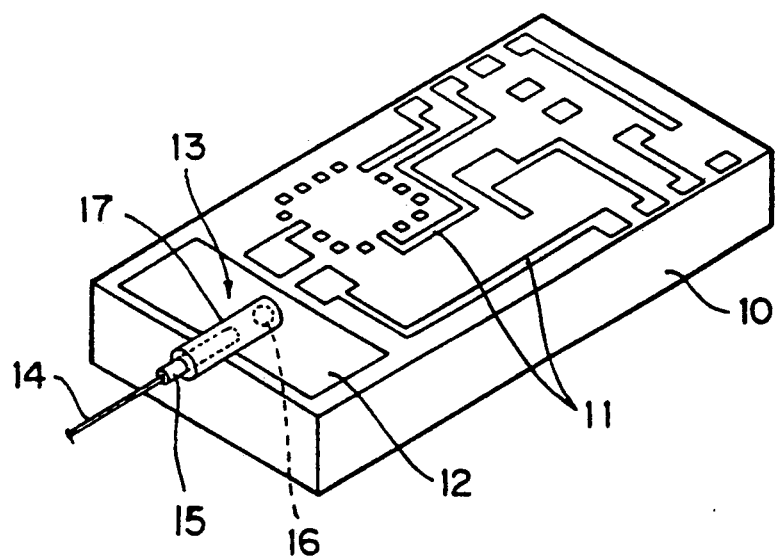
FIG. 2 is a perspective view of a conventional substrate for mounting optical components and electric circuit components thereon, with wiring patterns being formed on an insulating substrate and optical components fixed onto the substrate.

The present invention will be described in detail hereinunder in terms of embodiments thereof illustrated in the drawings.

Figure 3:
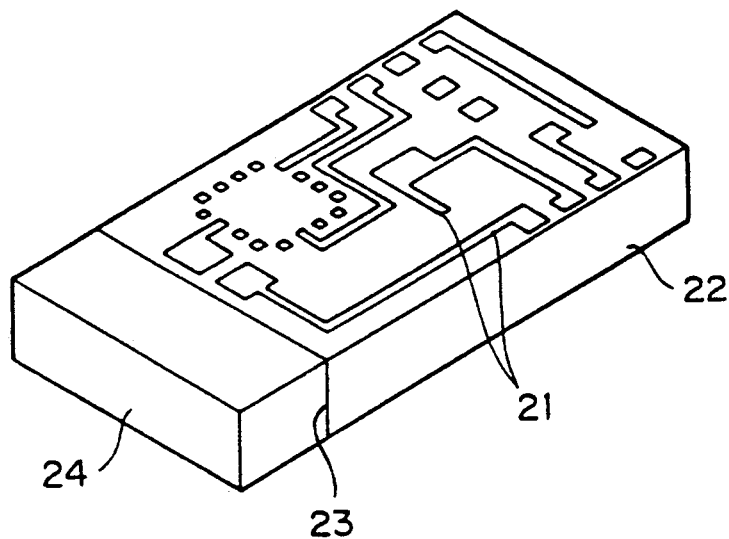
FIG. 3 is a perspective view of a substrate for mounting optical components and electric circuit components thereon according to an embodiment of the present invention.

Reference is here made to FIG. 3, which is a perspective view of a substrate for mounting optical components and electric circuit components thereon according to an embodiment of the present invention. In this embodiment, an insulating substrate 22 with wiring patterns 21 formed thereon capable of mounting electric components such as flat chip IC, chip resistor, etc. flatwise thereon is bonded at an end face 23 thereof to a metallic block 24. As the insulating substrate 22, a ceramic board or a multilayered board of ceramic material is suitable from the standpoint of heat resistance at the time of bonding thereof with the metallic block 24. Particularly, where the electric circuit to be formed is required to have a high frequency characteristic, it is desirable to use a multilayered ceramic board which permits easy formation of a strip line. As the metal of the metallic block 24, it is suitable to use stainless steel such as SUS 304 (Japanese Industrial Standard), beryllium copper, Kovar and the like. The insulating substrate 22 and the metallic block 24 may be bonded together by a method involving forming a metallic layer which is easily bondable by vapor deposition or plating on the surface of the bonding end face 23 of the insulating substrate and, if necessary, also on the bonding end face of the metallic block and bonding the two together using a soldering agent such as a metal solder or a metal-oxide mixture solder, or by a high-melting metal method.

Figure 4:
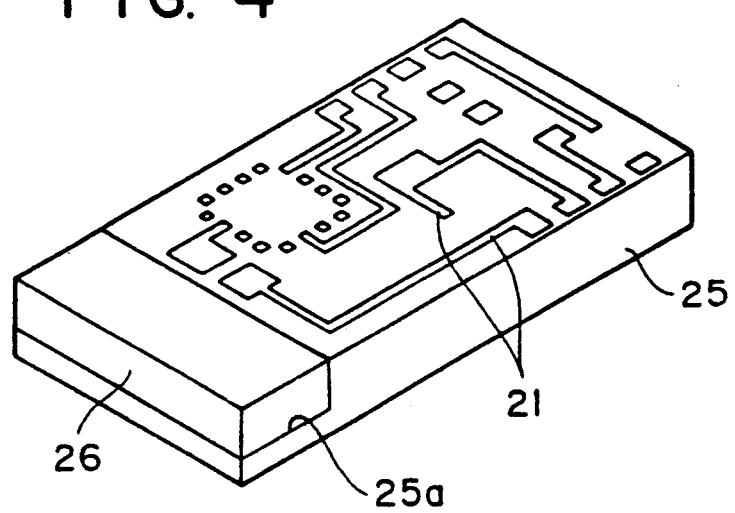
FIG. 4 is a perspective view of a substrate according to another embodiment of the present invention.

In the embodiment illustrated in FIG. 4, a thin-walled portion 25a is formed in the vicinity of an end portion of an insulating substrate 25 with wiring patterns 21 formed thereon, and a metallic block 26 is bonded to the thin-walled portion 25a. In connection with the properties of the component and bonding method, there also may be adopted direct formation of the metallic block 26 by spray coating, in addition to the methods described in the above embodiment. According to this embodiment, a high strength can be attained as a whole irrespective of the bonding strength, and in the case where an electric circuit is to be formed on the back of the insulating substrate 25, it is possible to form the electric circuit over the whole surface of the back.

According to the embodiments illustrated in FIGS. 3 and 4, it is possible to form an electric circuit by the conventional surface mounting technique, and optical components can be fixed onto the metallic block directly by a welding technique such as laser welding, so it is possible to dispose the two in close proximity to each other, thus permitting improvement of the frequency band characteristic and reduction in size of the device. Further, since the creeping phenomenon at the welded portion is extremely slight, the optical components are prevented from being displaced with the lapse of time with respect to the metallic block, whereby there is attained a long-term stabilization of optical coupling efficiency.

Figure 5:
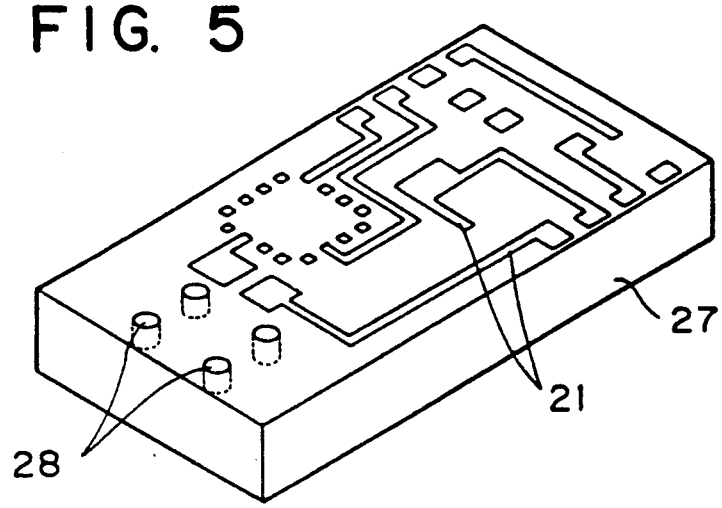
FIG. 5 is a perspective view of a substrate according to a further embodiment of the present invention.

In the embodiment illustrated in FIG. 5, a plurality of metallic lands 28 are disposed dispersedly at the portion of an insulating substrate 27 where optical components are to be fixed, with wiring patterns 21 being formed on the substrate 27. According to one means for forming the metallic lands 28, in the production of a sintered matrix for cutting out the insulating substrate 27 therefrom, a plurality of metallic rods serving as the metallic lands 28 are embedded in the matrix, then the matrix is sintered, followed by cutting into a desired thickness. According to another means for forming the metallic lands, cylindrical holes are formed in the insulating substrate 27 so as to extend through the substrate or halfway through the substrate and a metal is melted and solidified in the interior of each of such holes. Or as will be explained below, the metallic lands may be formed by press-fitting.

Figure 6:
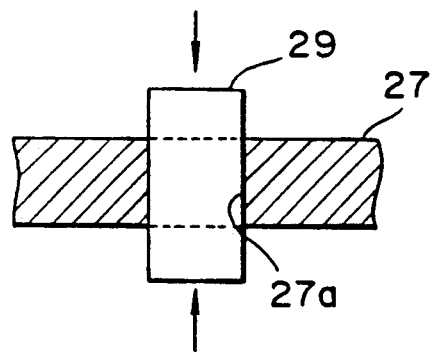
FIG. 6 is an explanatory view showing a method for making the substrate of the embodiment of FIG. 5.

FIG. 6 is an explanatory view of a method for forming metallic lands by press-fitting. Insertion holes 27a extending from the top surface to the back of the insulating substrate 27 are formed by fitting cores in the substrate at the time of sintering or by grinding after sintering. Then, a cylindrical metal member 29 longer than the thickness of the insulating substrate 27 is fitted in each of the insertion holes 27a in close contact therewith. Then, the metal member 29 is deformed by applying an impact force thereto in the arrowed directions in the figure from both end face sides of the metal member to increase the frictional force with the insertion hole 27a and thereby fix the metal member firmly to the insertion hole. Thereafter, the portions of the metal member 29 projecting from the top surface and the back of the insulating substrate 27 are cut. In this way there are formed metallic lands.

Figure 7:
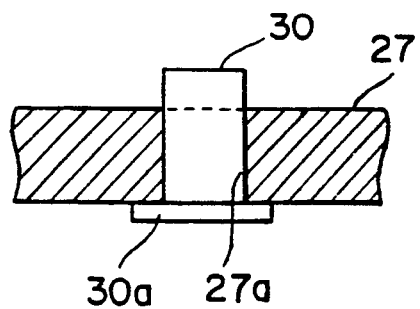
FIG. 7 is an explanatory view showing another manufacturing method.

FIG. 7 is an explanatory view of another metallic land forming method. According to this method, a rivet-like metal member 30 having a larger-diameter portion 30a formed at one end thereof is inserted into each insertion hole 27a of the insulating substrate 27, then it is deformed in the same manner as in the method shown in FIG. 6 and thereafter cut at the surface of the insulating substrate 27.

In the embodiment shown in FIG. 5, the metallic lands 28 are disposed dispersedly, so in the case where plural optical components are disposed dispersedly on the same substrate or a relatively large optical component is mounted thereon, it is possible to reduce the size of the metallic portion and so the stress developed at the bonded part between the metallic portion and the insulating substrate can be reduced. Moreover, when plural optical components are fixed, the spaced distance between fixed portions permits an optical axis deviation between optical components to be kept to a minimum because of stability to the change in ambient temperature due to a generally small coefficient of linear thermal expansion. Also, by annealing the bonded part between each metallic land 28 and the insulating substrate 27 in advance or by using a material having a small coefficient of linear thermal expansion as the material of the insulating substrate 27, it is possible to minimize the aforesaid optical axis deviation.

Figure 8:
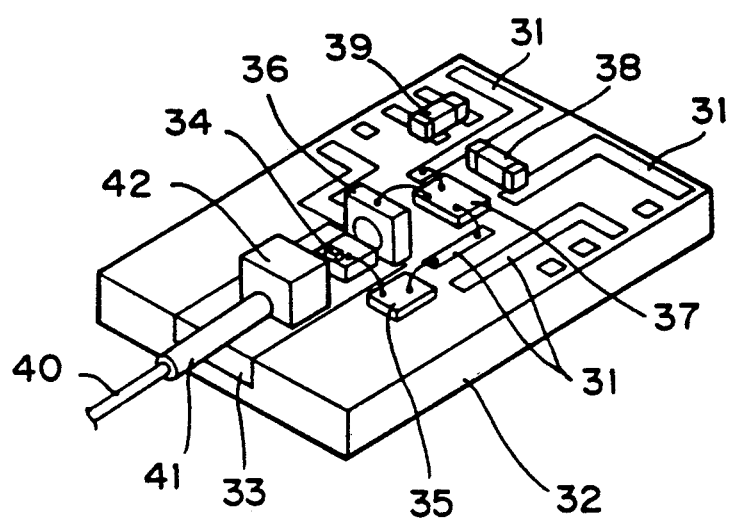
FIG. 8 is a perspective view of a substrate according to the present invention, with optical components being mounted on a metallic portion and electric circuit components mounted on an insulating substrate.

FIG. 8 is a perspective view showing a state in which a metallic portion 33 has been formed by any of the aforementioned methods in an insulating substrate 32 having wiring patterns 31 formed thereon, and electric circuit components mounted on the insulating substrate 32 have been interconnected with the wiring patterns 31 to constitute an electric circuit, with optical components being fixed to the metallic portion 33. The formation of the electric circuit onto the insulating substrate 32 is attained by interconnecting electric circuit components such as a photosemiconductor device 34, e.g. LD, an IC for a photosemiconductor driving circuit, a light sensing element 36 for monitoring light, an IC 37 for making drive control in accordance with a detected signal from the light sensing element, chip resistors 38, 39, and other electric circuit components (not shown), for example by reflow soldering to the wiring patterns 31 or by wiring using bonding wires.

The fixing of optical components to the metallic portion 33 is attained by placing a metallic ferrule 41 which supports optical fiber 40 and an optical isolator 42 having a metallic housing on the metallic portion 33 in a predetermined positional relation to the photosemiconductor device 34 and then performing a laser welding in the best position. In general, it is desirable that the wiring around the photosemiconductor device 34 be as short as possible if high frequency characteristic is considered. According to the present invention, the photosemiconductor device 34 as a constituent of both the optical circuit and the electric circuit can be disposed in close proximity to the other constituents of the electric circuit, so the above requirement can be fully satisfied and it is possible to provide an optical device having a good frequency band characteristic.

Figure 9:
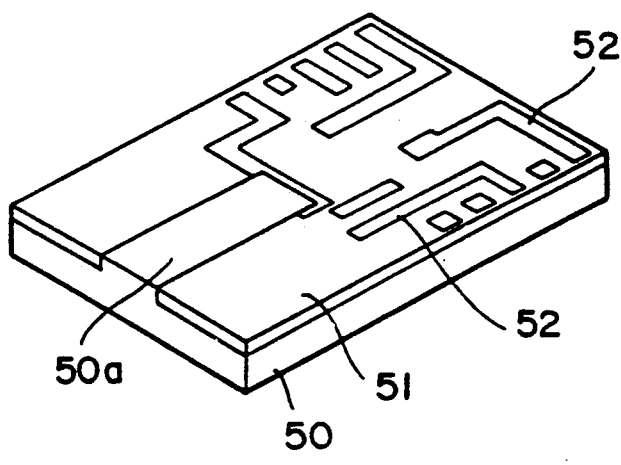
FIG. 9 is a perspective view of a substrate for mounting optical components and electric circuit components thereon according to a still further embodiment of the present invention.

Although in each of the embodiments described above a metallic portion is formed on the insulating substrate by bonding or the like, the substrate for mounting optical components and electric circuit components thereon is not limited to such mode. For example, as shown in FIG. 9, an insulator layer may be formed on a metallic board. In FIG. 9, the numeral 50 denotes a metallic board, on which is formed an insulator layer 51 using a ceramic material for example, with wiring patterns 52 being formed on the insulator layer 51. Numeral 50a denotes a planar convex portion of the metallic board 50, the convex portion 50a being formed so as to be substantially flush with the insulator layer 51.

Figure 10A:
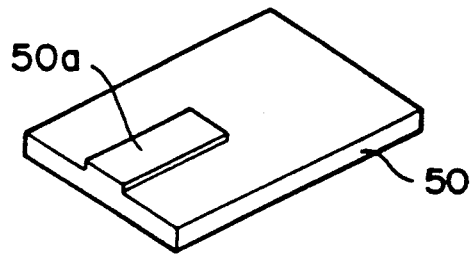
FIGS. 10A–10D are views explanatory of manufacturing steps for the substrate shown in FIG. 9.
Figure 10B:
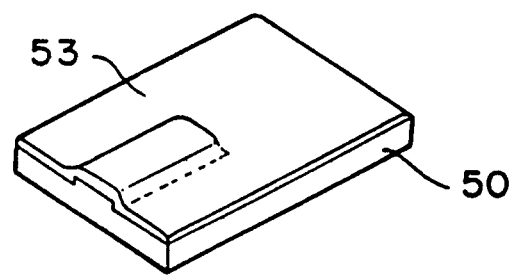
Figure 10C:
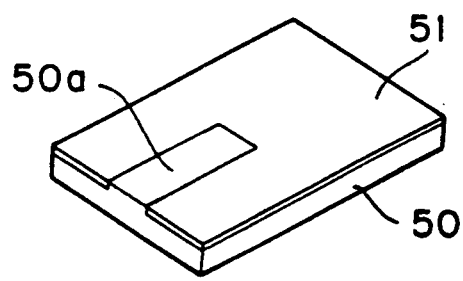
Figure 10D:
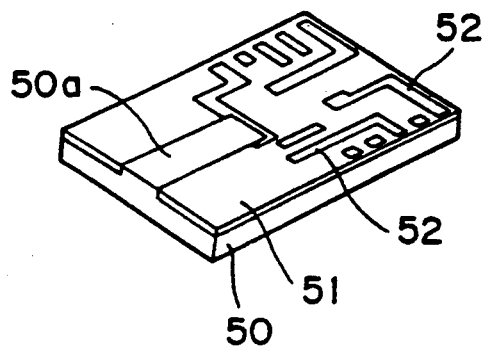

FIGS. 10A-10D show an example of manufacturing steps for the substrate illustrated in FIG. 9. First, the planar convex portion 50a is formed on the portion of the metallic board 50 where optical components are to be fixed (FIG. 10A). As the material of the metallic board 50, stainless steel, e.g. SUS 304 (Japanese Industrial Standard), beryllium copper, or Kovar, is suitable from the standpoint of preventing cracking at the welded portion between the metallic board and optical components. Then, a ceramics layer 53 is formed on the convex portion-formed side of the metallic board 50 directly by spray coating (FIG. 10B). The ceramics layer 53 is then abraded to expose the planar convex portion 50a so that the insulator layer 51 formed of a ceramic material and the convex portion 50a are substantially flush with each other (FIG. 10C). Lastly, wiring patterns 52 are formed on the surface of the insulator layer 51 by vapor deposition for example (FIG. 10D). The substrate obtained through such manufacturing steps is easy to handle because it has flat surfaces on the top and the back sides thereof, and is also advantageous in that the positions where optical components are to be fixed can be changed freely.

The formation of the insulator layer can also be effected by bonding an insulating substrate to a metallic board like the embodiments shown in FIGS. 3 and 4, in addition to the foregoing direct spray coating of a ceramic material.

Figure 11:
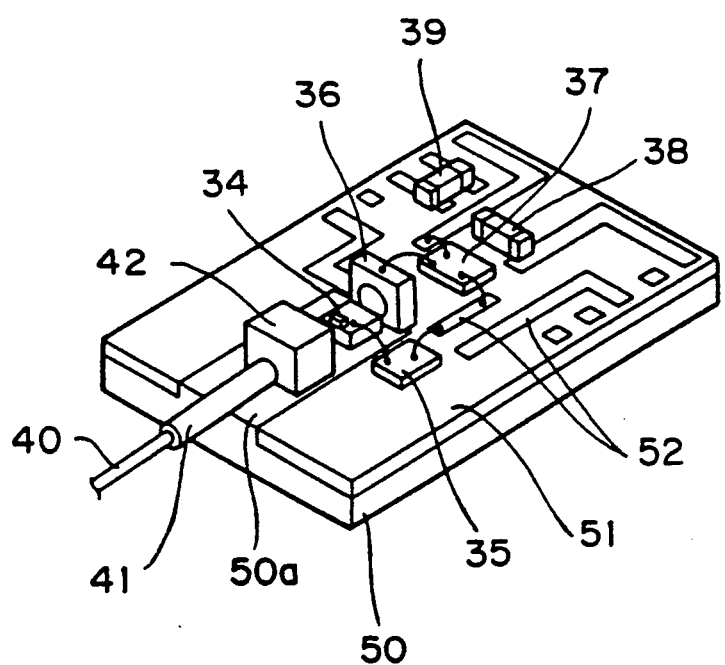
FIG. 11 is a perspective view of a substrate of FIG. 9, with optical components being mounted on an exposed portion of a metallic board and electric circuit components mounted on an insulator layer.

FIG. 11 is a perspective view of the substrate shown in FIG. 9 with the same optical components and electric circuit components as in FIG. 8 mounted thereon. The components substantially the same as the components shown in FIG. 8 are indicated by the same reference numerals and will not be explained here.

According to the present invention, as set forth hereinabove, it is possible to effect on a single substrate the positioning and fixing of optical components and the formation of an electric circuit, so it becomes possible to improve the frequency band characteristic of the device constituted using the substrate and attain the reduction in size of the device and a long-term stabilization of optical coupling efficiency.

We claim:

1. A substrate for mounting optical components and electric circuit components thereon, said optical components being defined as at least one of a lens, prism, mirror and optical fiber, said substrate comprising an insulating substrate with wiring patterns formed thereon for the mounting of said electric circuit components, said insulating substrate being provided with a metallic portion to which said optical components are to be fixed by welding, wherein said metallic portion of said insulating substrate is thicker than said wiring patterns.

2. A substrate for mounting optical components and electric circuit components thereon according to claim 1, wherein said metallic portion includes a metallic block, said metallic block being fixedly connected to said insulating substrate.

3. A substrate for mounting optical components and electric circuit components thereon according to claim 2, wherein said metallic block and said insulating substrate are welded together through a metallic layer.

4. A substrate for mounting optical components and electric circuit components thereon according to claim 2, wherein said insulating substrate is a ceramic substrate and said metallic block is formed from a stainless steel.

5. A substrate for mounting optical components and electric circuit components thereon according to claim 1, wherein said metallic portion includes metallic lands disposed dispersedly on said insulating substrate.

6. A substrate for mounting optical components and electric circuit components thereon according to claim 5, wherein said metallic lands are formed by embedding a plurality of metallic rods in said insulating substrate at the time of formation of the latter followed by sintering and subsequent cutting into a predetermined length.

7. A substrate for mounting optical components and electric circuit components thereon according to claim 5, wherein said metallic lands are formed by forming cylindrical holes in said insulating substrate at the time of formation of the latter and then allowing a metal to be melted and solidified in said holes.

8. A substrate for mounting optical components and electric circuit components thereon according to claim 5, wherein said metallic lands are formed by press-fitting at least one of metallic rods and metallic rivets into said insulating substrate.

9. A substrate for mounting optical components and electric circuit components thereon, said optical components being defined as at least one of a lens, prism, mirror and optical fiber, said substrate comprising a metallic board to which said optical components are to be fixed by welding, and an insulator layer with wiring patterns formed thereon for the mounting of said electric circuit components, said insulator layer being formed on said metallic board, wherein said metallic board is thicker than said wiring patterns.

10. A substrate for mounting optical components and electric circuit components thereon according to claim 9, wherein said insulator layer is formed by an insulating substrate, and said insulating substrate and said metallic board are welded together through a metallic layer.

11. A substrate for mounting optical components and electric circuit components thereon according to claim 9, wherein said metallic board is formed from a stainless steel and said insulator layer is formed from a ceramic material.

12. A method for making a substrate for mounting optical components and electric circuit components thereon, which method comprises:
    forming an insertion hole through the top surface to the back of an insulating substrate;
    inserting a cylindrical metal member longer than the thickness of said insulating substrate into said insertion hole in close contact therewith;
    applying impact to the end portions of said cylindrical metal member to cause deformation thereof, thereby fixing said cylindrical metal member firmly to said insulating substrate; and
    cutting said cylindrical metal member so as to become substantially flush with the top surface of said insulating substrate.

13. A method for making a substrate for mounting optical components and electrical circuit components thereon, which method comprises:
    forming a convex portion on a metallic board where optical components are to be fixed;
    forming a ceramic layer on the convex portion-formed side of said metallic board by spray coating;
    abrading said ceramic layer to expose said convex portion; and
    forming wiring patterns on the abraded surface of the ceramic layer.

* * * * *